United States Patent
Sekiya

[11] Patent Number: 6,061,288
[45] Date of Patent: May 9, 2000

[54] SEMICONDUCTOR DEVICE

[75] Inventor: Shin Sekiya, Hyogo, Japan

[73] Assignee: Mitsubishi Denki Kabushiki Kaisha, Tokyo, Japan

[21] Appl. No.: 09/210,819

[22] Filed: Dec. 15, 1998

[30] Foreign Application Priority Data

Jul. 2, 1998 [JP] Japan .................................. 10-187719

[51] Int. Cl.[7] ................................................... G11C 7/00
[52] U.S. Cl. ......................................... 365/205; 365/208
[58] Field of Search .................................. 365/205, 207, 365/208, 190

[56] References Cited

U.S. PATENT DOCUMENTS

| | | | |
|---|---|---|---|
| 4,868,823 | 9/1989 | White | 365/201 |
| 5,270,977 | 12/1993 | Iwamoto | 365/201 |
| 5,539,700 | 7/1996 | Kawahara | 365/203 |

*Primary Examiner*—A. Zarabian
*Attorney, Agent, or Firm*—McDermott, Will & Emery

[57] ABSTRACT

There is described a semiconductor device including a memory block which has a plurality of sense amplifier columns and a plurality of memory cells capable of establishing continuity with one of the plurality of sense amplifier columns. The semiconductor device enables simultaneous designation of row and column addresses. Sense amplifier columns and memory arrays are arranged such that the sense amplifier columns alternate with the memory arrays. By designation of a row address, memory cells pertaining to a relevant column are connected to the sense amplifier column, and the thus-connected sense amplifier column is activated. Data line connection transistors are provided between a sense amplifier and a pair of data lines. Further, the sense amplifier column is provided with an AND circuit which receives a column selection signal produced through designation of the column address and an activation signal SON used for activating the sense amplifier. A signal output from the AND circuit is supplied to the data line connection transistors by way of a sub-column selection line.

7 Claims, 5 Drawing Sheets

SEMICONDUCTOR DEVICE

BACKGROUND OF THE INVENTION

1. Field of the Invention

The present invention generally relates to a semiconductor device, and more particularly, to a semiconductor device which includes DRAM comprising a plurality of sense amplifier columns and a plurality of memory cells capable of establishing continuity with one of the sense amplifier columns.

2. Description of the Background Art

A DRAM comprising a plurality of memory arrays and a plurality of sense amplifier columns has already been known. In conventional DRAM, the plurality of memory arrays and the plurality of sense amplifier columns are arranged alternately. Each memory array comprises a plurality of memory cells arranged two-dimensionally, and each sense amplifier column comprises a plurality of sense amplifiers arranged in a columnar direction of the memory arrays. A plurality of bit lines are provided between the memory arrays and the sense amplifier columns. Each bit line is provided for each row of the memory arrays. The plurality of memory cells pertaining to each row of memory arrays are connected to a sense amplifier by way of a same bit line.

FIG. 5 shows a portion of conventional DRAM. More particularly, FIG. 5 shows portions of two sense amplifier columns 10 and 12 as well as a portion of a memory array 14 interposed between the sense amplifier columns. Each of the sense amplifier columns 10 and 12 comprises a plurality of circuits which are equal in configuration to sense amplifiers 16 and 18 depicted in the drawing and are arranged in a columnar direction (i.e., in a vertical direction in FIG. 5). In the memory array 14, there is provided a plurality of memory cells two-dimensionally, each of which being capable of conduction with one of the sense amplifier columns 10 and 12.

The sense amplifier 16 comprises a pair of P-type MOS transistors 20 and 22 as well as a pair of N-type MOS transistors 24 and 26. The P-type MOS transistors 20 and 22 are connected to the power source by way of another P-type MOS transistor 28 (referred to as an "activating transistor 28" hereunder). Further, the N-type MOS transistors 24 and 26 are grounded by way of another N-type MOS transistor 30 (referred to as an "activating transistor 30" hereunder).

The activating transistors 28 and 30 receive at their gate terminals activation signals SOP or SON, respectively. The activation signal SOP changes from a high level to a low level when the sense amplifier 16 is required to be active. The activation signal SON changes from a low level to a high level when the sense amplifier 16 is required to be active. The sense amplifier 16 is brought into activation or inactivation upon receipt of the activation signals SON and SOP.

The P-type MOS transistor 22 and the N-type transistor 26 are connected to a signal input line 32 and a signal transmission line 34 at their gate terminals. The signal input line 32 is connected to a bit line (BL) 40 by way of a bit-line selection transistor 36, and to a bit line (BL) 42 by way of a bit-line selection transistor 38. In contrast, the signal transmission line 34 is connected to a data line (DATA) 45 by way of a data line connection transistor 44.

Likewise, the P-type MOS transistor 20 and the N-type transistor 24 are connected to a signal input line 46 and a signal transmission line 47 at there gate terminals. The signal input line 46 is connected to a bit line (/BL) 52 by way of a bit-line selection transistor 48 and to a bit line (/BL) 54 by way of a bit-line selection transistor 50, respectively. In contrast, the signal transmission line 47 is connected to a data (/DATA) line 58 by way of a data line connection transistor 56. The DATA line 45 and the /DATA line 58 will be generically referred to as a "DATA lines pair 45 and 58."

The bit lines BL40 and /BL52 are capable of conduction with a memory array (not shown) provided on the left side of the sense amplifier column 10. In contrast, the bit lines BL42 and /BL54 are capable of conduction with the memory array 14 provided on the right side of the sense amplifier column 10. The bit lines BL40 and /BL52 will be referred generically to as a "bit lines pair 40 and 52", and the bit lines BL42 and /BL54 will be generically referred to as a "bit lines pair 42 and 54."

The sense amplifier columns 10 and 12 have equal configurations. More specifically, the sense amplifier column 12 comprises a bit lines pair 40' and 52' which connect the sense amplifier 18 to the memory array 14 provided on the left side of the sense amplifier 18; and the data line connection transistors 44' and 56' interposed between the sense amplifier 18 and the DATA lines pair 45' and 58'.

A plurality of memory cell columns included in the memory array 14 are divided into a first group of columns and a second group of columns. The first group of columns are connected to the sense amplifier column 10 while the second group of columns are connected to the sense amplifier column 12. More particularly, each of the bit lines BL42 and /BL54 shown in FIG. 5 connected to the sense amplifier column 10 is connected to a plurality of cells which pertain to the same row within the memory array 14 and pertain to the first column group. Further, each of the bit lines BL40' and /BL52' shown in FIG. 5 connected to the sense amplifier column 12 is connected to a plurality of cells which pertain to the same row within the memory array 14 and pertain to the second column group.

A row selection signal generation circuit (not shown) is provided at the end of the memory array 14. A plurality of memory cells pertaining to each column of the memory array 14 are connected to the row selection signal generation circuit by way of the same row selection signal line (not shown). It is to be noted that the memory cells connected to the BLs (including BL42) and the counter parts connected to the /BLs (including /BL50) are connected to the row selection generation circuit by way of different row selection signal lines, respectively. The memory cell becomes able to read and write data upon receipt of a row selection signal from the row signal selection circuit.

The conventional DRAM comprises a column selection line 60. The column selection line 60 is connected to the data line connection transistors 44 and 56 provided to the sense amplifier column 10, as well as to the data line connection transistors 44 and 56 provided to the sense amplifier column 12. The DRAM comprises a plurality of sense amplifier columns arranged in parallel with the sense amplifier columns 10 and 12. These sense amplifier columns have data line connection transistors 44' and 56' as the sense amplifier columns 10 and 12 have. The column selection line 60 is connected to all the sense amplifiers arranged along the same row by way of the data line connection transistors 44 and 56.

The DRAM has column selection lines analogous to the line 60 for the individual rows of sense amplifiers. These column selection lines are connected to column selection signal generation circuit (not shown). Upon receipt of a column address signal from the outside, the column selection signal generation circuit outputs a column selection signal to a column selection line corresponding to the address.

The read operation of the conventional DRAM will now be described. In a case where read operation is requested to the DRAM, a row address is imparted to the DRAM. When the row address signal is imparted to the DRAM as mentioned above, the row selection signal generation circuit to be processing the address generates a row selection signal corresponding to the address. As a result, the row selection signal is supplied to all the memory cells pertaining to the column designated by the address.

The memory cells of the memory array 14 output data to the bit lines corresponding to the respective cells when receiving to the row selection signal. At the same time, the BLs and /BLs to which no data is supplied from the memory cells are maintained at a predetermined reference potential. More specifically, when the column capable of conduction with the bit line BL42 or /BL54 is designated by the row selection signal, the memory array 14 outputs data to a plurality of bit lines including BL42 or a plurality of bit lines including /BL54. Similarly, when a column capable of conduction with the bit line BL40 or /BL52 is designated by a row selection signal, data are output from the memory array 14 to the bit lines corresponding to the activated memory cells of the memory array. While one of bit lines 42, 54, 40' and 52' is receiving the data in the manner described above, other three bit lines are controlled to the reference potential.

During the read operation, either a plurality of transistor pairs (including a pair of transistors 38, 50) provided on the left side of the memory array 14 or a plurality of transistor pairs (including a pair of transistors 36', 48') provided on the right side of the memory array 14 are activated. In the foregoing processing, which is to be activated the right-side transistor pairs or the left-side transistor pairs is decided on the basis of the column designated by the row selection signal.

The following explanation will describe a case where a column capable of conduction with the bit line BL42 is designated. Under the conditions described previously, the data are output from the memory cells to a plurality of bit lines including the bit line BL42. In this case, the transistor pairs (including the pair of transistors 38, 50) provided on the left side of the memory cell 14 are activated. As a result, the signal input line 32 is supplied with data from the memory cells, whereas the signal input line 46 is fed with a reference potential.

The memory cell outputs the electric charge stored therein to the bit line. When the data represent "1," the memory cell changes the potential of the bit line toward predetermined potential Vcc by only ΔV. In contrast, when the data represent "0," the memory cell changes the potential of the bit line toward ground level potential Vss by only AV. The reference potentials for the bit lines BL42, /BL54, BL40, and /BL52 are set to Vcc/2. Accordingly, under the foregoing conditions, after activation of the bit line selection transistors 38 and 50, the signal input line 32 receives (Vcc/2)+ΔV or (Vcc/2)-ΔV while the signal input line 46 receives Vcc/2.

The activating transistors 28 and 30 are brought into activation subsequent to the foregoing processing. When both the activating transistors 28 and 30 are activated, the sense amplifier 15 amplifies a potential difference between the signal input liens 32 and 46 and outputs the thus-amplified potential difference to the signal transmission lines pair 34 and 47. As a result, there appears potential difference corresponding to the data of the memory cells between all the signal transmission line pairs provided to the sense amplifier column 10. Hereinafter, the operations performed to implement the state describe above will be referred to as a "sense operation."

During the read operation, a column address signal is input to the column selection signal generation circuit after the sense operation. Where the column address corresponds to the column selection line 60, the column selection signal generation circuit activates the column selection line 60. When the column selection line 60 is activated, all the data line connection transistors (including the transistors 44, 56) connected to the line 60 are turned on.

At the time when the column selection line 60 is brought into activation, the signal transmission lines pair 34 and 47 connected to the sense amplifier 16 is fed with signals corresponding to the data of the memory cell. In contrast, at the same time, the signal transmission lines pairs connected to other data line connection transistors are held at high impedance. Accordingly, when the column selection line 60 is activated in the manner as mentioned previously, there appear only to the DATA lines 45 and 58 the signals fed to the signal transmission lines pair 34 and 47. As mentioned above, the DRAM outputs data of a memory cell to the DATA lines 45 and 58 when the memory cell is designated by its row and column addresses.

An effective measure to increase the operating speed of the DRAM is to divide the memory cells pertaining to the same memory block into a plurality of banks and to activate the banks in an asynchronous manner. However, when a plurality of banks are operated in an asynchronous manner, a bank which has already completed a sense operation may be requested to be operative while another bank is performing a sense operation. In this case, a column selection line connected to the plurality of banks including the later bank is brought into activation.

When the column selection line is brought into activation, all the sense amplifiers connected to the column selection line, i.e., a plurality of sense amplifiers including the sense amplifier which is currently performing the sense operation, are brought into conduction with the DATA lines. Under these circumstances, the signal output from the sense amplifier which has been already finished the sense operation may be supplied to the sense amplifier which is currently performing a sense operation. If a signal is supplied from the DATA line to the sense amplifier which is currently performing a sense operation, the data supplied to the sense amplifier from the memory cell may be damaged. For this reason, in the conventional DRAM, it has been difficult to form a plurality of banks within the same memory block and to operate the banks in an asynchronous manner.

SUMMARY OF THE INVENTION

The present invention has been conceived to solve the previously-mentioned problems, and a general object of the present invention is to provide a novel and useful semiconductor device.

A more specific object of the present invention is to provide a semiconductor device which is capable of operating a plurality of memory cells pertaining to different banks of the same memory block in an asynchronous manner.

The above object of the present invention is achieved by a semiconductor device including a plurality of sense amplifier columns and a plurality of memory cells capable of conduction with one of the plurality of sense amplifier columns. The device includes a row address operation unit which, when a row address is designated, connects a plurality of memory cells corresponding to the designated row address to a relevant sense amplifier column; a sense amplifier activation unit which, when the row address is designated, activates sense amplifiers pertaining to the relevant sense amplifier column; a first data line connection unit which connects the sense amplifiers to data lines through activation; and a column address operation unit which, when a column address is designated, activates the first data line connection unit corresponding to the designated column address and provided for the sense amplifiers that have been activated.

The above object of the present invention is also achieved by a semiconductor device including a plurality of sense amplifier columns and a plurality of memory cells capable of conduction with one of the plurality of sense amplifier columns. The device includes a row address operation unit which, when a row address is designated, connects a plurality of memory cells corresponding to the designated row address to a relevant sense amplifier column; a sense amplifier activation unit which, when the row address is designated, activates sense amplifiers pertaining to the relevant sense amplifier column; a second and a third data line connection units which connect the sense amplifiers to data lines by activation of both of them; a first column address operation unit which, when a column address is designated, activates the second data line connection unit provided for the sense amplifiers corresponding to the designated column address; and a second column address operation unit which activates the third data line connection unit provided for the activated sense amplifiers.

Other objects and further features of the present invention will be apparent from the following detailed description when read in conjunction with the accompanying drawings.

DESCRIPTION OF THE PREFERRED EMBODIMENTS

Figure 1:
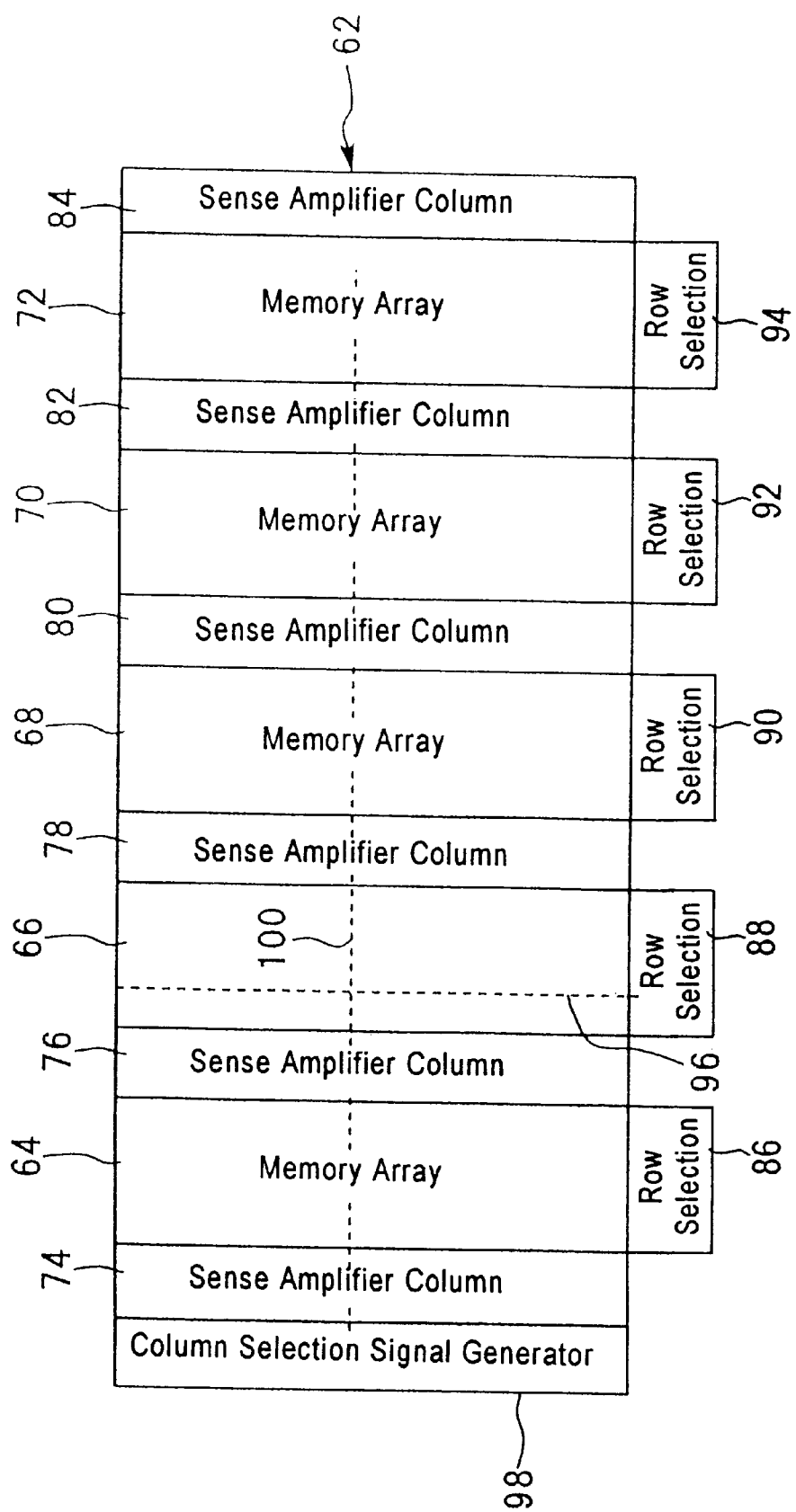
FIG. 1 is a plane view showing a memory block of a semiconductor device according to a first embodiment of the present invention.

In the following, principles and embodiments of the present invention will be described with reference to the accompanying drawings.
First Embodiment FIG. 1 shows a memory block 62 of a DRAM according to a first embodiment of the present invention. The memory block 62 comprises a plurality of memory arrays 64 to 72 and a plurality of sense amplifier columns 74 to 84. The memory arrays 64 to 72 and the sense amplifier columns 74 to 84 are arranged alternately.

The memory arrays 64 to 72 comprise a plurality of memory cells arranged two-dimensionally in a row direction (i.e., a horizontal direction in FIG. 1) and in a columnar direction (i.e., a vertical direction in FIG. 1). Further, each of the sense amplifier columns 74 to 84 comprises a plurality of sense amplifier arranged in a columnar direction.

Each of the memory arrays 64 to 72 comprises memory cells pertaining to a first group of columns and a second group of columns. The memory cells pertaining to the first group of columns are capable of being brought into conduction with a sense amplifier column which is provided on the left side thereof whereas the memory cells pertaining to the second group of columns are capable of being brought into conduction with a sense amplifier columns which is provided of the right side thereof. The plurality of sense amplifiers of the sense amplifier columns 74 to 84 amplify signals when receiving the signals from either the left-side or right-side memory arrays 64 to 72.

Row selection signal generation circuits 86 to 94 are provided at the respective ends of the memory arrays 64 to 72. The row selection signal generation circuits 86 to 94 generate a row selection signal for selecting one column of memory cells from a plurality of memory cell columns of the memory arrays 64 to 72. Dotted line 96 provided in FIG. 1 denotes an example of a row selection signal generated by the row selection signal generation circuit 88.

A column selection signal generation circuit 98 is provided at the end of the memory block 62. The column selection signal generation circuit 98 produces a column selection signal for selecting a group of sense amplifiers pertaining to the same column from a group of sense amplifiers pertaining to the sense amplifier columns 74 to 84. Dotted line 100 shown in FIG. 1 denotes an example of column selection signal produced by the column selection signal generation circuit 98.

Figure 2:
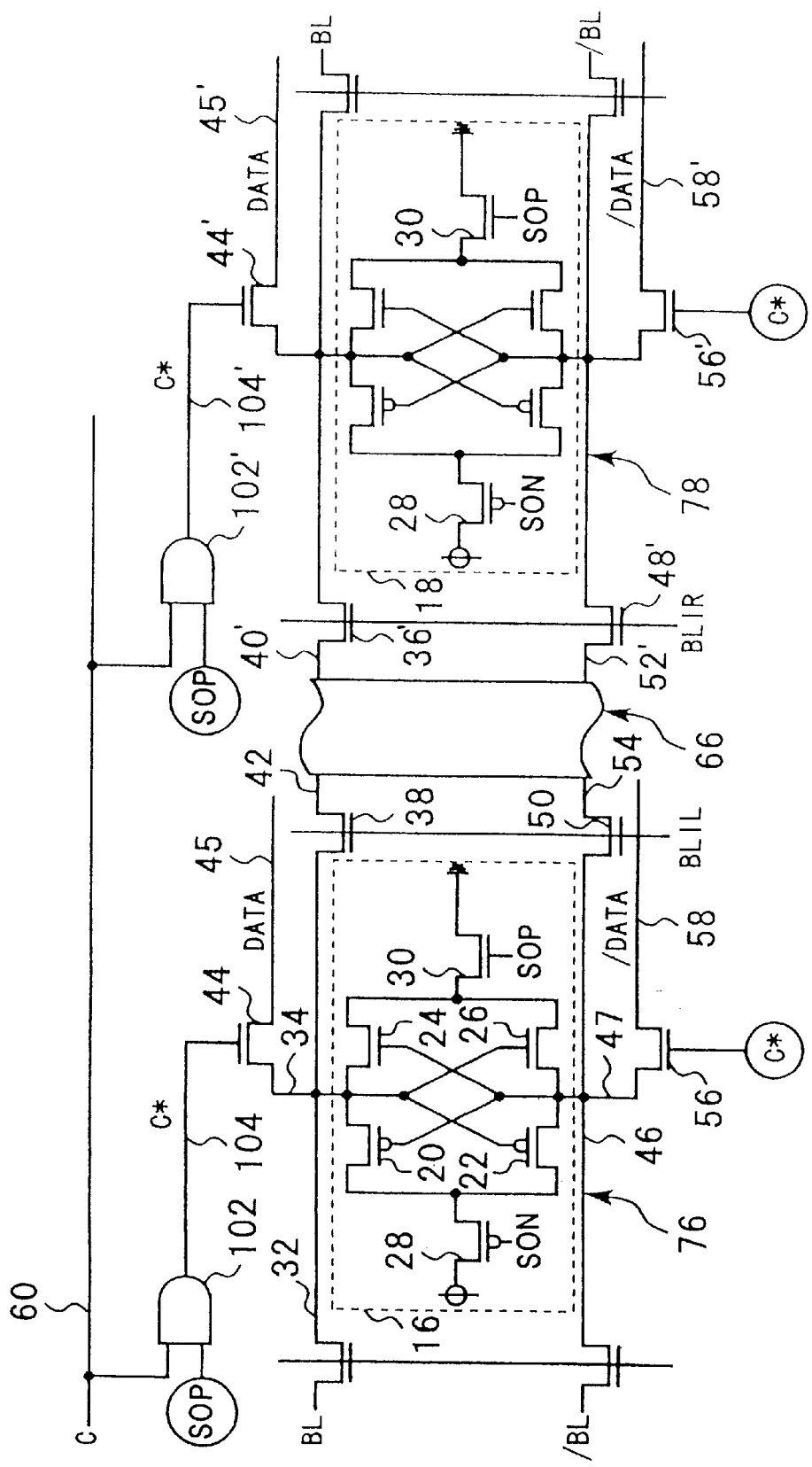
FIG. 2 is a circuit diagram showing a portion of the semiconductor device according to the first embodiment.

FIG. 2 shows a portion of the DRAM according to the first embodiment; more particularly, portions of two sense amplifier columns 76 and 78 and a portion of a memory array 66 interposed between the sense amplifier columns 76 and 78. The sense amplifier columns 76 and 78 respectively comprise a plurality of sense amplifiers which are equal in configuration to the sense amplifiers 16 and 18 shown in the drawing. The sense amplifiers of the columns 76 and 78 are arranged in a columnar direction (i.e., the vertical direction in FIG. 2). Further, a plurality of memory cells capable of conduction with either the sense amplifier column 76 or 78 are arranged two-dimensionally in the memory array 66.

The sense amplifier 16 comprises a pair of P-type MOS transistors 20 and 22 as well as a pair of N-type MOS transistors 24 and 26 as the conventional DRAM has. The P-type MOS transistors 20 and 22 are connected to a power source by way of another P-type MOS transistor 28, i.e., an activating transistor 28. Further, the N-type MOS transistors 24 and 26 are grounded by way of another N-type MOS transistor 30, i.e., an activating transistor 30.

The activating transistors 28 and 30 receive an activation signal SOP or SON, respectively, at the gate terminal thereof. The activation signal SOP changes from a high state to a low state when activation of the sense amplifier 16 is required. In contrast, the activation signal SON changes from a low level to a high level when activation of the sense amplifier 16 is required. The sense amplifier 16 is brought into activation or deactivation upon receipt of the signals SON and SOP.

The P-type MOS transistor 22 and the N-type MOS transistor 26 are connected to both A signal input line 32 and a signal transmission line 34 at the gate terminals thereof. The signal input line 32 is connected to the bit line (BL) 40 by way of the bit-line selection transistor 36 and to the bit line (BL) 42 by way of the bit-line selection transistor 38. In contrast, the signal transmission line 34 is connected to a data (DATA) line 45 by way of a data line connection transistor 44.

Likewise, the P-type MOS transistor 20 and the N-type MOS transistor 24 are connected to both a signal input line 46 and a signal transmission line 47 at the gate terminals thereof. The signal input line 46 is connected to the bit line (/BL) 52 by way of the bit-line selection transistor 48 and to the bit line (/BL) 54 by way of the bit-line selection transistor 50. In contrast, the signal transmission line 47 is connected to a data (/DATA) line 58 by way of a data line connection transistor 56. The DATA line 45 and the /DATA line 58 will be generically referred to as a "DATA lines pair 45 and 58."

The bit lines BL40 and /BL52 are capable of conduction with a memory array 64 (see FIG. 1) provided on the left side of a sense amplifier column 76. In contrast, the bit lines BL42 and /BL54 are capable of conduction with a memory array 66 provided on the right side of the sense amplifier column 76. The bit lines BL40 and /BL52 will be generically referred to as a "bit lines pair 40 and 52," as well as the bit lines BL42 and /BL54 will be referred generically to as a "bit lines pair 42 and 54."

The sense amplifier columns 76 and 78 have equal configurations. More specifically, the sense amplifier column 78 comprises a bit lines pair 40 and 52 which connect the sense amplifier 18 to the memory array 66 provided on the left side of the sense amplifier, and the data line connection transistors 44' and 56' interposed between the sense amplifier 18 and the DATA lines 45' and 58'.

A plurality of columns of memory cells included in the memory array 66 are divided into a first group and second group. The memory cells pertaining to the first group of columns are connected to the sense amplifier column 76 while the memory cells pertaining to the second group of columns are connected to the sense amplifier column 78. In FIG. 2, the bit lines BL42 and /BL54 connected to the sense amplifier column 76 is connected to a plurality of memory cells-each of which is a part of a column of the first group and all of which pertain to the same row within the memory array 66. Further, the bit lines BL40' and /BL 52' denoted in FIG. 2, which is connected tc, the sense amplifier column 78, is connected to a plurality of memory cells—each of which is a part of a column of the second group and all of which pertain to the same row—within the memory array 66.

As mentioned previously, there is provided the row selection signal generation circuit 88 at the end of the memory array 66. A plurality of memory cells pertaining to each column of the memory array 66 are connected to the row selection signal generation circuit 88 by way of the same row selection signal line (not shown). It is to be noted that the memory cells connected to the BLs (including BL42) and the counter parts connected to the /BLs (including /BL50) are connected to the circuit 88 by way of different row selection signal lines, respectively. The memory cells become able to read or write data upon receipt of a row selection signal from the row signal selection circuit 88.

Further, the DRAM according to the first embodiment has a column selection signal generation circuit 98 (see FIG. 1) at the end of the memory block 62. A plurality of column selection lines are connected to the column selection signal generation circuit 98. Each of the column selection lines is provided for individual rows of sense amplifiers of the sense amplifier columns 74 to 84. More specifically, the sense amplifiers pertaining to the respective rows of the sense amplifier columns 74 to 84 are provided so as to be able to establish continuity with the same column selection line.

The column selection line 60 shown in FIG. 2 is a line corresponding to the row including the sense amplifiers 16 and 18. The column selection signal generation circuit 98 supplies a column selection signal to an appropriate column selection line at given timing upon receipt of a column address signal from the outside.

As shown in FIG. 2, the column selection line 60 is connected to one of two input terminals of an AND circuit 102. The other input terminal of the AND circuit 102 receives an activation signal SON to be supplied to the activation transistor 30. An output terminal of the AND circuit 102 is connected to the gate terminals of the data line connection transistors 44 and 50 by way of a sub-column selection line 104. The DRAM according to the first embodiment is characterized in that the data line connection transistors 44 and 56 are controlled by an OR result of the column selection signal and the activation signal SON.

Data read operations of the DRAM according to the first embodiment will now be described. During the read operation of the DRAM, one row address is imparted to the DRAM first. When the row address is imparted to the DRAM in the forgoing manner, the row selection signal generation circuit which is to process the address supplies a row selection signal to all the memory cells pertaining to the column corresponding to the address. An explanation will now be given of a case where the row selection signal generation circuit 86 issues a row selection signal 96.

When the row selection signal 88 is issued, all the cells pertaining to a column capable of receiving the row selection signal 96 (the column is called a "row designated column" hereunder) among the memory cells of the memory array 66 output data to the bit lines (BL or /BL) provided so as to correspond to the memory cells. As a result, data are output from the memory cells to the bit line BL42', BL40', /BL54', or /BL52'. While one of the bit lines 42, 54, 40' and 52' is receiving the data in the manner described above, other three bit lines are controlled to a predetermined reference potential. The following description is based on the assumption that the row designated column will be one which outputs data to the bit line BL42.

Then, a plurality of transistor pairs (including a pair of transistors 38, 50) provided on the left side of the memory array 66 are brought into activation. Incidentally, in a case where the row designated column outputs data to the bit line BL40 or /BL52, the plurality of transistor pairs (including a pair of transistors 36', 48') provided on the right side of the memory array 66 are brought into activation.

When the transistor pairs (including the pair of transistors 38, 50) provided on the left side of the memory cell 66 are activated in a manner mentioned above, data are guided from the memory cell to the input line 32 of the sense amplifier 16, and a reference potential is supplied to the other input line 46 of the same. The memory cell outputs the electric charge stored therein to the bit line. In a case where the data represent "1," the potential of the bit line is changed toward the given potential Vcc by only AV according to the amount of stored electric charges. In contrast, in a case where the data represent "0," the potential of the bit line is changed toward the grounded level potential Vss by only $\Delta V$ according to the amount of stored electric charges. In the first embodiment, the reference potential for the bit lines 42, 54, 40, and 52 is set to Vcc/2. Accordingly, under the foregoing conditions, after activation of the bit line selection transistors 38 and 50, (Vcc/2)+$\Delta V$ or (Vcc/2)−$\Delta V$ is input to the signal input line 32, and Vcc/2 is supplied to the signal input line 46.

In the DRAM according to the first embodiment, subsequent to the foregoing operations, all the activating transistors (including the activating transistors 28, 30) pertaining to the sense amplifier column 76 are activated. More specifically, the activation signal SOP supplied to the sense amplifier 76 is changed from a high state to a low state, and the other activation signal SON is changed from a low state to a high state.

As a result of the foregoing processing operations, as with another sense amplifier of the sense amplifier column 76, the sense amplifier 16 amplifies a potential difference between the signal input lines 32 and 46 and outputs the thus-amplified potential difference to the pair of signal transmission lines 34 and 47. As mentioned above, in the DRAM according to the first embodiment, data is guided to the sense amplifier 16 by designation of a row address and by turning on the bit line selection transistors 38 and 50. Further, the amplified signal is supplied to the pair of signal transmission lines 34 and 47 by subsequent activation of the sense amplifier 16.

In the data read process, one column address is supplied from the outside to the column selection signal generation circuit 98 of the DRAM. When the column address is produced in a manner mentioned above, the column selection signal generation circuit 98 supplies a column selection signal to a column selection line corresponding to the column address. The following description will be given of a case where the column selection signal is supplied to the column selection line 60 through the foregoing processing.

The column selection signal supplied to the column selection line 60 is supplied to all the AND circuits connected to the column selection line 60, including the AND circuit 102. These AND circuits will be hereinafter referred to as "column designated AND circuits." According to the foregoing operation timing, at a time when the column selection signal is produced, the AND circuit 102 has already received the activation signal SON which has changed to a high state. Accordingly, after receipt of a column selection signal, the AND circuit 102 immediately activates the data line connection transistors 44 and 56. As a result, immediately after designation of a column address, the signal amplified by the sense amplifier 16 is supplied to the DATA lines pair 45 and 46.

The DRAM according to the first embodiment operates in such a way that a plurality of sense amplifier columns pertaining to the same memory bank are not simultaneously activated. According to the previously-described operation timing, at the time when the column selection signal is produced, all the column designated AND circuits exclusive of the AND circuit 102 have already received the low-level activation signal SON. In this case, the data line connection transistors connected to the AND circuits are held in an off state irrespective of whether or not a column selection signal is produced.

The sense amplifier corresponding to the transistor held in an off state is maintained in a state such that it is disconnected from the pair of DATA lines 45 and 58. Accordingly, the data output to the pair of DATA lines 45 and 58 in response to the column selection signal do not at all affect the data supplied to those sense amplifiers disconnected from the DATA lines. Under these circumstances, while data are output to the pair of DATA lines 45 and 58 from the sense amplifier 16, data can be supplied to the sense amplifier columns other than the sense amplifier column 76 from the memory array without involving data destruction.

The DRAM according to the first embodiment enables simultaneous designation of row and column addresses of a plurality of banks pertaining to the same memory block. Accordingly, the DRAM according to the first embodiment performs operations faster than does DRAM which cannot designate row and column addresses at one time.

Second Embodiment

A second embodiment of the present invention will now be described by reference to FIGS. 1 and 3. Those elements provided in both FIGS. 2 and 3 will be assigned the same reference numerals, and repetition of their explanations will be simplified or omitted here.

Figure 3:
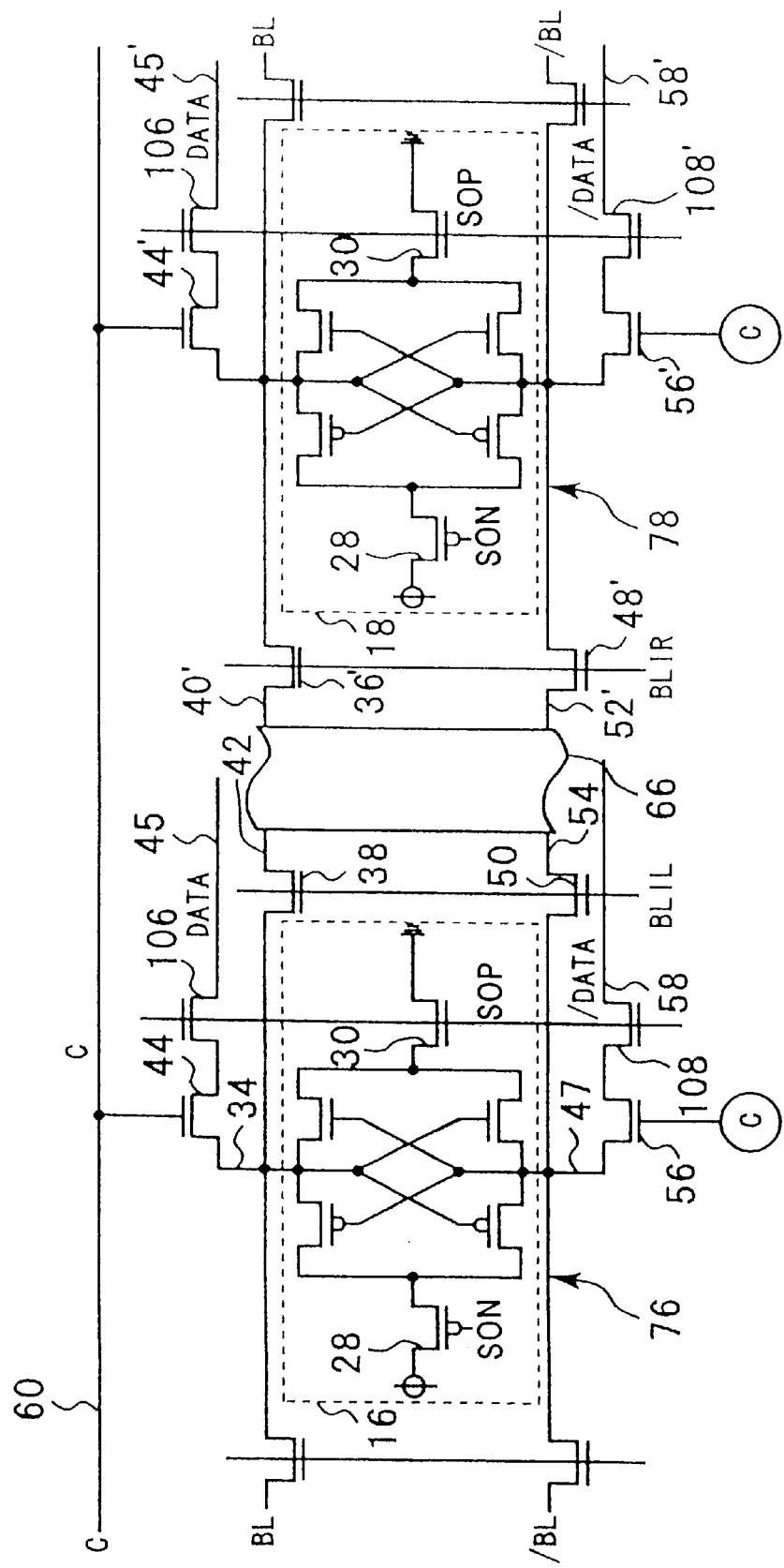
FIG. 3 is a circuit diagram showing a portion of a semiconductor device according to a second embodiment.

FIG. 3 shows a part of DRAM according to a second embodiment; more particularly, portions of two sense amplifier columns 76 and 78 and a portion of the memory array 66 interposed between the sense amplifier columns 76 and 78. According to the second embodiment, as in the case of the first embodiment, the sense amplifier columns 76 and 78 have a plurality of sense amplifiers which are equal in configuration to the sense amplifiers 16 and 18 shown in the drawing. Further, as in the case of the first embodiment, a plurality of memory cells capable of conduction with one of the sense amplifier columns 76 and 78 are arranged two-dimensionally in the memory array 66.

In the second embodiment, all the column selection lines (including the column selection line 60) are directly connected to the gate electrodes of the data line connection transistors (including transistors 44, 56, 44' and 56') of each of the sense amplifier columns (including the sense amplifier columns 76 and 78). The data line connection transistor 44 is connected to the DATA line 45 by way of an N-type MOS transistor 106, and the data line connection transistor 56 is connected to the DATA line 58 by way of an N-type MOS transistor 108. Further, the N-type MOS transistors 106 and 108 receive the activation signal SON supplied to the activating transistor 30.

Data read operations of the DRAM according to the second embodiment will now be described. The DRAM according to the second embodiment operates in the same manner as does the DRAM according to the first embodiment, whereby data are read from a memory cell and the thus-read data are amplified. More specifically, the DRAM according to the second embodiment designates row addresses, drives the pair of bit line selection transistors 38 and 50 or 36' and 52' appropriately, and activates the activating transistors 28 and 30 of a relevant sense amplifier to read data from a memory cell, amplifies the data, and outputs the amplified data to the pair of signal transmission lines 34 and 47.

An explanation will now be given of a case where the data are guided to the bit line BL42 from the memory cell, the reference voltage Vcc/2 is guided to the bit line /BL 54, and a potential difference between the bit lines BL42 and /BL 54 is amplified by means of the sense amplifier 16.

During the data read process, after implementation of the foregoing circumstances, one column address is supplied from the outside to the column selection signal generation circuit 98 (see FIG. 1). The following description applies to a case where the column selection signal generation circuit 98 supplies a column selection signal to the column selection line 60 in response to the column address.

In the DRAM according to the second embodiment, the column selection signal supplied to the column selection line 60 is supplied to all the data line connection including transistors 44 and 56 connected to the selection line 60. Hereinafter, the connection transistors fed with the column selection signal is referred to as column designated transistors. The column designated transistors are turned on immediately after receipt of the column selection signals.

According to the foregoing operation timing, at the time when the column designated transistors are turned on, the activating transistor 30 as well as the N-type MOS transistors 106 and 108 of the sense amplifier column 76 have already received the activation signal SON that has changed to a high state. Thus, the signal amplified by the sense amplifier 16 is supplied to the pair of DATA lines 45 and 58 immediately after designation of a column address.

The DRAM according to the second embodiment will be driven in such a way that a plurality of sense amplifier columns pertaining to the same memory bank are not activated simultaneously. Accordingly, the N-type MOS transistors (including 106' and 108' of the sense amplifier columns except the sense amplifier column 76 (called rest sense amplifier columns hereunder) are maintained in an off state at the time when the column designated transistors are turned on. Accordingly, the sense amplifiers pertaining to the rest sense amplifier columns are maintained disconnected from the pair of DATA lines 45 and 58 even when the column designated transistors are in an on state.

Under these circumstances, the data output to the pair of DATA lines 45 and 58 do not affect the data supplied to the sense amplifiers of the rest sense amplifier columns. The DRAM according to the second embodiment enables to output data to DATA lines pair 45 and 58 from the sense amplifier 16 and to supply data to the rest sense amplifier columns from memory arrays simultaneously without involvement of data destruction, as in the case of the first embodiment.

As mentioned above, the DRAM according to the second embodiment enables simultaneous designation of row and column addresses of a plurality of banks pertaining to the same memory block. Thus, the DRAM can perform operations faster than can DRAM which cannot designate row and column addresses simultaneously.

By means of the structure of the MOS according to the second embodiment, the previously-described superior functions are achieved by the two N-type MOS transistors 106 and 108 or the like added to each sense amplifier. In contrast, in order to accomplish the foregoing function, the structure of the DRAM according to the first embodiment requires addition of an AND circuit to each sense amplifier. Implementation of the AND circuit requires four or more transistors. In this respect, the DRAM according to the second embodiment has the advantage of being achievable by a simpler structure than is the DRAM according to the first embodiment.

Third Embodiment

DRAM according to a third embodiment will be described by reference to FIGS. 1 and 4. Those elements provided in FIG. 4 as well as FIGS. 2 or 3 will be assigned the same reference numerals, and repetition of their explanations will be simplified or omitted.

Figure 4:
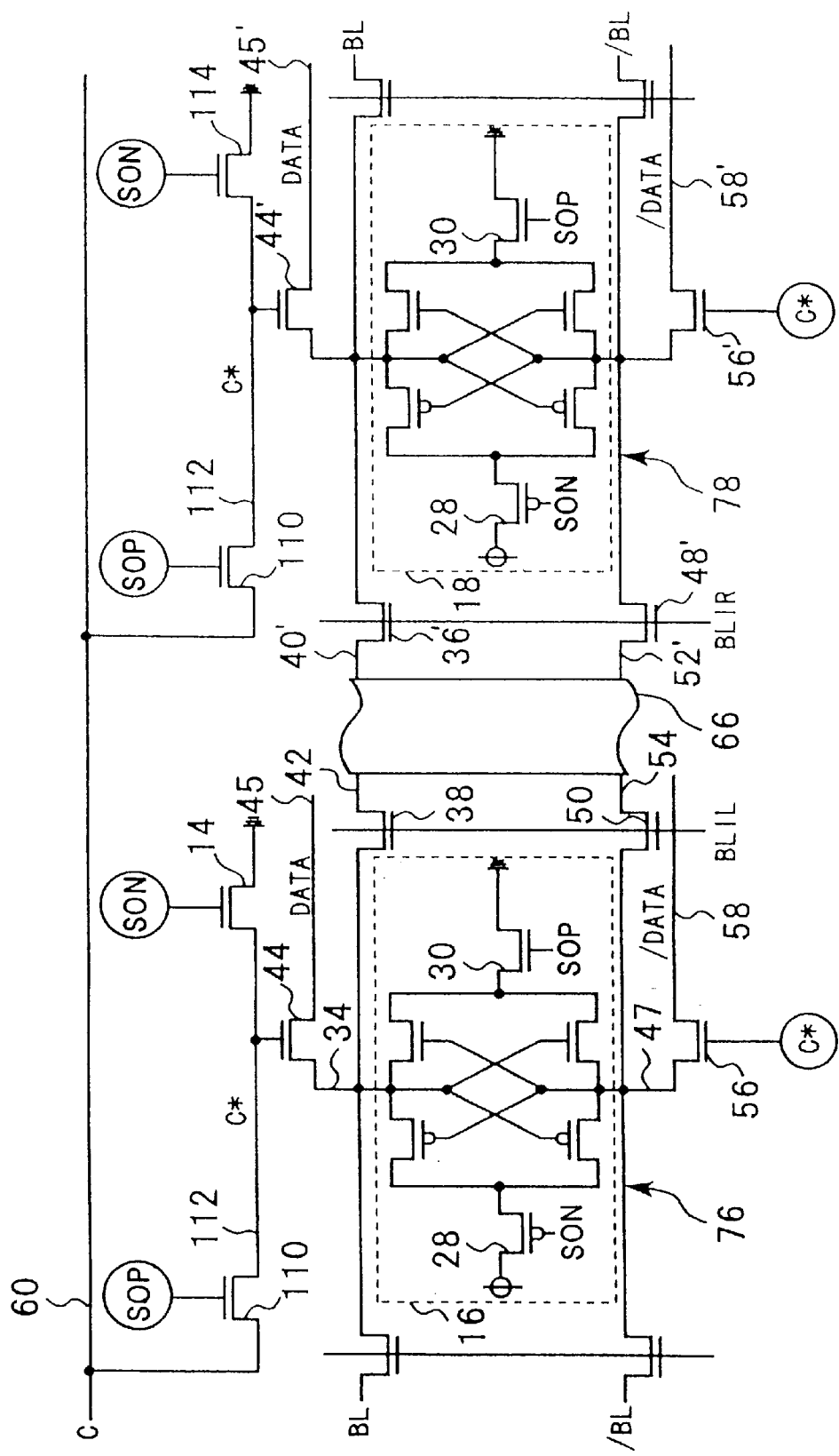
FIG. 4 is a circuit diagram showing a portion of a semiconductor device according to a third embodiment.
Figure 5:
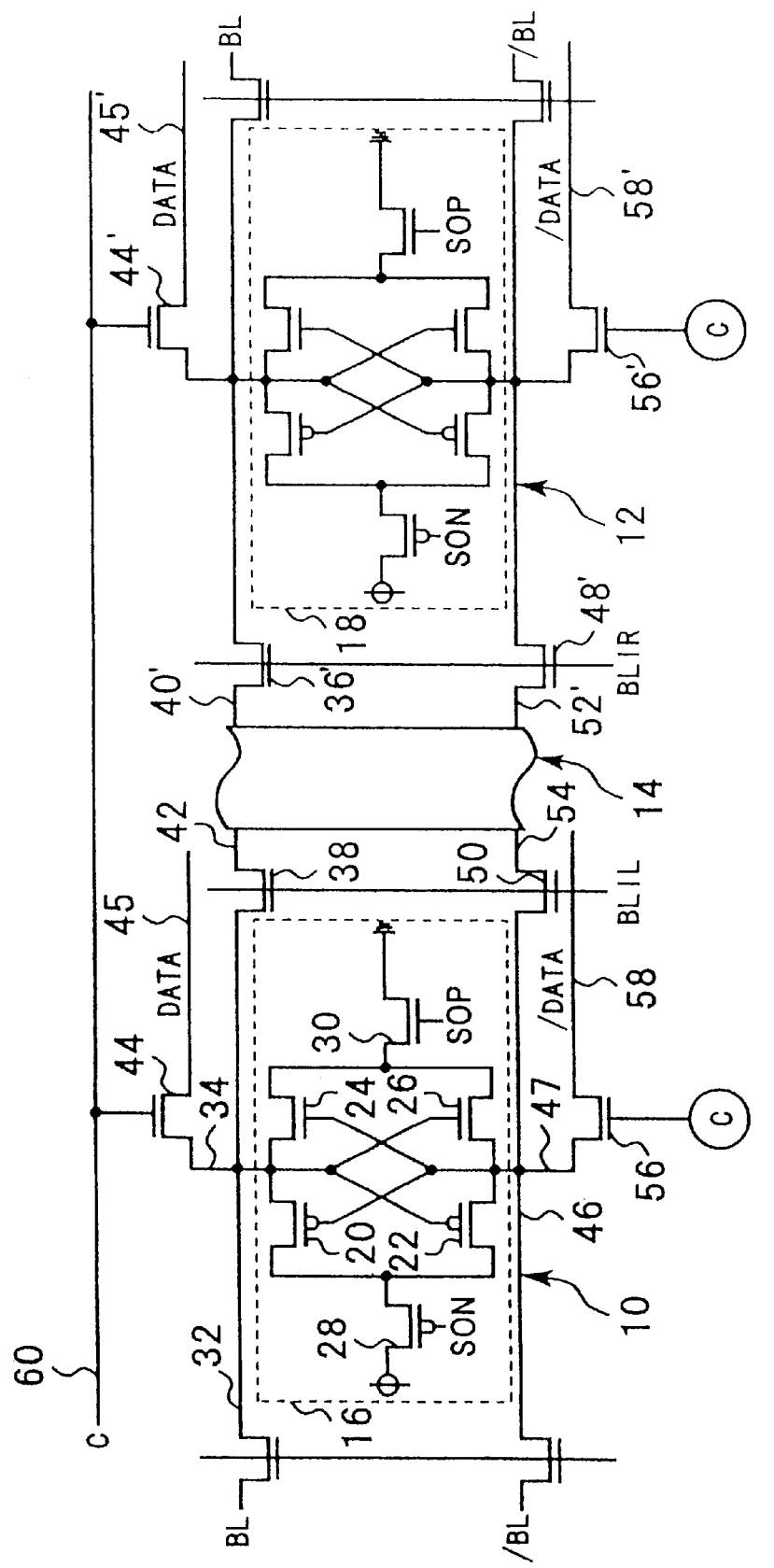
FIG. 5 is a circuit diagram showing a portion of a conventional semiconductor device.

FIG. 4 shows apart of DRAM according to a third embodiment; more particularly, portions of two sense amplifier columns 76 and 78 and a portion of the memory array 66 interposed between the sense amplifier columns 76 and 78. According to the third embodiment, as in the case of the first embodiment, the sense amplifier columns 76 and 78 have a plurality of sense amplifiers which are equal in configuration to the sense amplifiers 16 and 18 shown in the drawing. Further, as in the case of the first embodiment, a plurality of memory cells capable of conduction with one of the sense amplifier columns 76 and 78 are arranged two-dimensionally in the memory array 66.

In the third embodiment, all the column selection lines (including the column selection line 60) are connected to a plurality of first N-type MOS transistors 110. Each of the first N-type MOS transistors 110 is connected to one end of a second N-type MOS transistor 114 by way of a sub-column selection line 112. The second N-type MOS transistors 114 are grounded at the other end thereof.

The first N-type MOS transistor 110 receives the activation signal SON to be fed to the activating transistor 30 at the gate electrode thereof. In contrast, the second N-type MOS transistor 114 receives the activation signal SOP to be fed to the activating transistor 28 at the gate electrode thereof. In the third embodiment, the gate electrodes of the data line connection transistors (including transistors 44 and 56) corresponding to each sense amplifier are connected to the sub-column selection line 112.

Data read operations of the DRAM according to the third embodiment will now be described. The DRAM according to the third embodiment operates in the same manner as does the DRAM according to the first embodiment to read data from a memory cell and amplified thus-read data. More specifically, the DRAM according to the third embodiment designates row addresses, drives the pair of bit line selection transistors 38 and 50 or 36' and 52' appropriately, and activates the activating transistors 28 and 30 of a relevant sense amplifier to read data from a memory cell, to amplifies the data and output the amplified data to the signal transmission lines pair 34 and 47.

An explanation will now be given of a case where the data are guided to the bit line BL42 from the memory cell, the reference voltage Vcc/2 is guided to the bit line /BL54, and a potential difference between the bit lines BL42 and /BL54 is amplified by means of the sense amplifier 16.

In the data reading process, one column address is supplied from the outside to the column selection signal generation circuit 98 (see FIG. 1) after implementation of the foregoing circumstances. The following description applies to a case where the column selection signal generation circuit 98 supplies a column selection signal to the column selection line 60 in response to the column address.

In the DRAM according to the third embodiment, the column selection signal supplied to the column selection line 60 is supplied to all the first N-type MOS transistors 110 connected to the selection line 60. According to the foregoing operation timing, at the time when the column selection signal is issued, the first N-type MOS transistor 110 of the sense amplifier column 76 is provided with the high-level activation signal SON. At the same time, the second N-type MOS transistor 114 of the sense amplifier column 76 is provided with the low-level activation signal SOP.

Therefore, after issuance of the column selection signal, the sub-column selection line 112 corresponding to the sense amplifier 16 is provided with a high-level signal. As a result, the data line connection transistors 44 and 56 corresponding to the sense amplifier 16 are turned on, and the signal amplified by the sense amplifier 16 is output to the pair of DATA lines 46' and 58.

The DRAM according to the third embodiment is driven in such a way that a plurality of sense amplifier columns pertaining to the same memory bank are not activated simultaneously. According to the foregoing operation timing, sense amplifier columns except the sense amplifier column 76 (called rest sense amplifier columns hereunder) are provided with a low-level signal at the first N-type MOS transistors 110 as well as provided with a high-level signal at the second N-type MOS transistors 114 at the time when the column selection signal is issued.

As a result, after issuance of the column selection signal, all the sub-column selection lines 112 pertaining to the rest sense amplifier columns are maintained in a low state. When the sub-column selection lines 112 are in a low state, the data line connection transistors are held in an off state. Accordingly, the rest sense amplifiers are maintained disconnected from the pair of DATA lines 45' and 58'or the like. In this case, the data supplied to the DATA lines 45 and 58 from the sense amplifier 16 do not affect the data supplied to the rest sense amplifier columns.

The DRAM according to the third embodiment enables to output data to DATA lines pair 45 and 58 from the sense amplifier 16 and to supply data to the rest sense amplifier columns from memory arrays simultaneously without involvement of data destruction, as in the case of the DRAM according to the first embodiment. As mentioned above, the DRAM enables simultaneous designation of row and column addresses of a plurality of banks pertaining to the same memory block. Thus, the DRAM can perform faster operations than does DRAM which cannot designate row and column addresses simultaneously.

There maybe cases where DRAM is required to have a function of reading data from a plurality of sense amplifiers pertaining to the same sense amplifier column by means of one column selection signal. The DRAM according to the third embodiment enables to implement the foregoing function by connecting a plurality of sense amplifiers pertaining to the same sense amplifier column to one sub-column selection line 112 by way of the data line connection transistors 44, 56 44', 56' or the like.

By means of the structure mentioned above, the superior feature of the present invention, i.e., simultaneous designation of row and column addresses can be realized solely through use of two transistors (i.e., the first and second N-type MOS transistors 110 and 114) for the plurality of sense amplifiers connected to the same column selection line 112.

In contrast, the DRAM according to the first or the second embodiment cannot, through use of only two transistors, enable to designate a plurality of sense amplifiers by means of one column selection signal while designating row and column addresses simultaneously. In this respect, the structure of the DRAM according to the third embodiment has the advantage of being able to realize superior functions through use of fewer circuits than those required to the first or the second embodiment.

As mentioned previously, in the DRAM according to the third embodiment, the gate electrode of the data line connection transistor 44 receives a signal output from the first N-type MOS transistor 110. Because of the structure of the first N-type MOS transistor 110, the signal output from the transistor 110 is lower than the gate voltage by only a predetermined voltage. For this reason, according to the third embodiment, the high-level voltage of the activation signal SON is set so as to become higher than an operating voltage of the data line connection transistor 44 by the predetermined voltage or more. According to the foregoing settings, the data line connection transistor 44 can be reliably operated without being affected by a drop in the voltage of the first N-type MOS transistor 110.

Since the present invention has the configuration such as that mentioned previously, the invention yields the following advantageous effects.

According to a first aspect of the present invention, designation of a row address enables activation of sense amplifiers pertaining to a relevant sense amplifier column and supplying of data of a plurality of memory cells corresponding to the designated row address to the sense amplifiers. Further, designation of a column address enables the sense amplifiers that have already been activated to be brought into conduction with data lines while unactivated sense amplifiers are being disconnected from the data lines. Therefore, the present invention makes it possible to simultaneously cause a desired sense amplifier to output data to a data line by designation of a column address, and supply data to the sense amplifier from a desired memory cell by designation of a row address.

According to a second aspect of the present invention, data line connection transistor connects a sense amplifiers to a data line only when both a column selection signal and a activation signal for the sense amplifier assume a predetermined value. With the foregoing configuration, there can be readily achieved a function of selectively connecting only activated sense amplifiers to data lines.

According to a third aspect of the present invention, a data line connection transistor is controlled on the basis of an logical calculation result of the column selection signal and the sense amplifier activation signal. With the foregoing configuration, a desired function can be accomplished with a simple structure through use of the sense amplifier activation signal.

According to a fourth aspect of the present invention, a data line connection transistor is controlled by means of a signal guided to a sub-column selection line. When the column selection signal is supplied, both a high-level signal and a ground-level signal can be guided to the sub-column selection line according to the states of activation signals for a sense amplifier. Therefore, at the time of generation of a column selection signal, only the activated sense amplifiers can be selectively connected to data lines. By means of the foregoing function, it is possible to simultaneously cause a desired sense amplifier to output data to a data line by designation of a column address, and supply data to a sense amplifier from a desired memory cell by designation of a row address.

According to a fifth aspect of the present invention, transistors which control the signal level of the sub-column selection lines are controlled on the basis of the sense amplifier activation signal. With the foregoing configuration, a desired function can be achieved with a simple structure through use of the sense amplifier activation signal.

According to a sixth aspect of the present invention, the sense amplifiers are connected to the data lines when both of two transistors interposed between the sense amplifiers and the data lines are activated. One of those transistors is activated upon receipt of the column selection signal. The other transistor is activated when a corresponding sense amplifier is activated. Therefore, at the time of generation of a column selection signal, the present invention enables selective connection of only the activated sense amplifiers to the data lines. By means of the foregoing function, it is possible to simultaneously cause a desired sense amplifier to output data to a data line by designation of a column address, and supply data to a sense amplifier from a desired memory cell by designation of a row address.

According to a seventh aspect of the present invention, the other transistor is controlled on the basis of the sense amplifier activation signal. With the foregoing configuration, a desired function can be achieved with a simple structure through use of the sense amplifier activation signal.

Further, the present invention is not limited to these embodiments, but variations and modifications may be made without departing from the scope of the present invention.

What is claimed is:

1. A semiconductor device including a plurality of sense amplifiers which are imparted with an identical column address and a plurality of memory cells each of which is capable of conduction with one of the plurality of sense amplifiers, the device comprising:

row address operation means which connects a memory cell designated by a row address to a relevant sense amplifier;

sense amplifier activation means which activates the relevant sense amplifier;

a plurality of data line connection transistors each of which is provided between one of the plurality of sense amplifiers and one of a plurality of data lines; and column address operation means which activates some of the data line connection transistors selected based on a designated column address and the relevant sense amplifier activated.

2. The semiconductor device according to claim 1, wherein the column address operation means comprises:

column selection signal generation means which, when a column address is designated, supplies a column selection signal to a column selection line corresponding to the designated column address; and a logic circuit which receives the column selection signal and a first activation signal as input signals and outputs a signal to a data line connection transistor.

3. The semiconductor device according to claim 2, wherein the first activation signal is used for activating the relevant sense amplifier.

4. The semiconductor device according to claim 1, wherein the column address operation means comprises:

column selection signal generation means which, when a column address is designated, supplies a column selection signal to a column selection line corresponding to the designated column address;

a first transistor which operates upon receipt of the column selection signal and a second activation signal;

a sub-column selection line which supplies a signal output from the first transistor to the data line connection transistor; and a second transistor which grounds the sub-column selection line upon receipt of a third activation signal.

5. The semiconductor device according to claim 4, wherein the second and third activation signals are used for activating the sense amplifier.

6. A semiconductor device including a plurality of sense amplifiers which are imparted with an identical column address and a plurality of memory cells each of which is capable of conduction with one of the plurality of sense amplifiers, the device comprising:

row address operation means which connects a memory cell designated by a row address to a relevant sense amplifier;

sense amplifier activation means which activates the relevant sense amplifier;

a plurality of first and second data line connection transistors, each of the plurality of first transistors and each of the plurality of second transistors being serially provided between the one of the plurality of sense amplifiers and one of a plurality of data lines;

first column address operation means which activates some of the first data line connection transistors selected based on a designated column address; and second column address operation means which activates some of the second data line connection transistors selected based on the relevant sense amplifier activated.

7. The semiconductor device according to claim 6, wherein the second column address operation means supplies to the second data line connection transistors an activation signal used for activating the sense amplifiers.

\* \* \* \* \*